US008049575B2

(12) United States Patent
Fluhrer

(10) Patent No.: US 8,049,575 B2
(45) Date of Patent: Nov. 1, 2011

(54) DIRECTIONAL COUPLER WITH INDUCTIVELY-COMPENSATED SHARPNESS OF DIRECTIVITY

(75) Inventor: Christoph Fluhrer, Neuried (DE)

(73) Assignee: Rohde & Schwarz GmbH & Co. KG, München (DE)

( * ) Notice: Subject to any disclaimer, the term of this patent is extended or adjusted under 35 U.S.C. 154(b) by 11 days.

(21) Appl. No.: 12/443,807

(22) PCT Filed: Jun. 13, 2008

(86) PCT No.: PCT/EP2008/004791

§ 371 (c)(1),
(2), (4) Date: May 14, 2009

(87) PCT Pub. No.: WO2009/000434

PCT Pub. Date: Dec. 31, 2008

(65) Prior Publication Data

US 2010/0182098 A1 Jul. 22, 2010

(30) Foreign Application Priority Data

Jun. 25, 2007 (DE) ......................... 10 2007 029 127

(51) Int. Cl.
*H01P 5/18* (2006.01)
*H03H 7/00* (2006.01)

(52) U.S. Cl. ....................................... 333/116; 333/109

(58) Field of Classification Search .................. 333/109, 333/110, 111, 112, 115, 116
See application file for complete search history.

(56) References Cited

U.S. PATENT DOCUMENTS 5,424,694 A 6/1995 Maloratsky et al.
5,666,090 A * 9/1997 Tsuruoka ..................... 333/116
6,600,386 B1 7/2003 Lobl et al.
7,151,422 B2 12/2006 Pivit et al.

FOREIGN PATENT DOCUMENTS

DE 1112559 8/1961
DE 103 42 611 4/2005
EP 1 047 150 10/2000
JP 10 290108 10/1998

OTHER PUBLICATIONS

International Search Report for PCT/EP2008/004791 dated Sep. 24, 2008.

* cited by examiner

*Primary Examiner* — Dean Takaoka
(74) *Attorney, Agent, or Firm* — Marshall, Gerstein & Borun LLP

(57) ABSTRACT

A directional coupler provides at least two coupled lines, at least three ports and at least one inductor. A high-frequency signal is transmitted from the first coupled line to the second coupled line. The circuit is constructed in stripline technology. In this context, the second coupled line provides a forward path and a return path, which are connected to a port. An inductor is connected in series to the return path.

20 Claims, 4 Drawing Sheets

DIRECTIONAL COUPLER WITH INDUCTIVELY-COMPENSATED SHARPNESS OF DIRECTIVITY

BACKGROUND OF THE INVENTION

1. Field of the Invention

The invention relates to a directional coupler for directional transmission of high-frequency signals.

2. Related Technology

With regard to the prior art, reference is made, for example, to U.S. Pat. No. 5,424,694, wherein a directional coupler is described, which is constructed in stripline technology on a substrate plane. The frequency response of the directional coupler is influenced by ohmic resistors and inductors. However, a superposition of signals for the exploitation of interference does not take place.

SUMMARY OF THE INVENTION

Coupled lines are used conventionally in directional couplers. However, only a poor sharpness of directivity can be achieved with a single-layer structure on a printed circuit board. A sharpness of directivity of more than 30 dB can be achieved using a conventional structure only with at least three layers or with a mechanically very complex structure or through an explicit optimization of the sharpness of directivity of every individual directional coupler during manufacture.

The invention provides a directional coupler, which provides a good sharpness of directivity within the desired frequency range with a low cost for the construction of the circuit.

Accordingly, the invention provides a directional coupler with at least two coupled lines and at least three ports for the directional transmission of high-frequency signals, wherein the high-frequency signal from the first coupled line is transmitted to the second coupled line, wherein the second coupled line is connected via a forward path and via a return path to a port of the second coupled line, and a first inductor is connected in series to the return path.

The directional coupler according to the invention provides at least two coupled lines, at least three ports and at least one inductor. A high-frequency signal is transmitted from the first coupled line to the second coupled line. In this context, the second coupled line provides a forward path and a return path, which are connected to a common port. A first inductor is connected in series to the return path. This structure of the circuit allows the desired good sharpness of directivity within the desired frequency range.

The first coupled line advantageously provides at least two ports. The second coupled line advantageously provides at least one port. This structure allows signals to be impressed into the circuit and picked up from the circuit.

The desired coupling is implemented from a first port of the first line to a port of the second line. A coupling of this kind is advantageously effected with the minimum possible attenuation. A coupling from a second port of the first line to the port of the second line is not desired. Such a coupling is advantageously implemented with strong attenuation. Accordingly, a good sharpness of directivity is attainable.

The second coupled line is advantageously connected to an absorber or wave absorber. The circuit is preferably constructed in stripline technology. The circuit is advantageously constructed on the front side of a substrate. The rear side of the substrate is advantageously metallised. The absorber is advantageously formed by an ohmic connection to the metallised rear side of the substrate, which advantageously provides reference potential or ground potential. The connection to an absorber ensures a reflection-free termination.

The length of the forward path and/or the length of the return path and/or the size of the first inductor advantageously determine the transmission properties and the sharpness of directivity of the circuit in a frequency-dependent manner. The desired frequency characteristic of the sharpness of directivity can be tuned by determining the three parameters.

The third port of the circuit is advantageously connected in series to a second inductor and advantageously in parallel to a capacitor. The second inductor and the capacitor advantageously form an LC-element. The frequency characteristic of the sharpness of directivity and of the transmission properties can be accurately determined via the size of the second inductor and the size of the capacitor. This allows an even greater flexibility in tuning the frequency characteristic of the sharpness of directivity.

By preference, two second coupled lines and two first inductors are used. Accordingly, a point-symmetrical structure of the directional coupler is advantageously achieved, wherein the point of symmetry is disposed on the first line. As a result of the symmetrical structure, both coupling directions are realized in the directional coupler.

BRIEF DESCRIPTION OF THE DRAWINGS

The invention is described by way of example with reference to the drawings, which illustrate an advantageous exemplary embodiment of the invention. The drawings are as follows.

DETAILED DESCRIPTION

The structure and functioning of the circuitry for a directional coupler according to the invention are explained with reference to FIGS. 1-4. In some cases, the description and presentation of identical elements in similar drawings has not been repeated.

Figure 1:
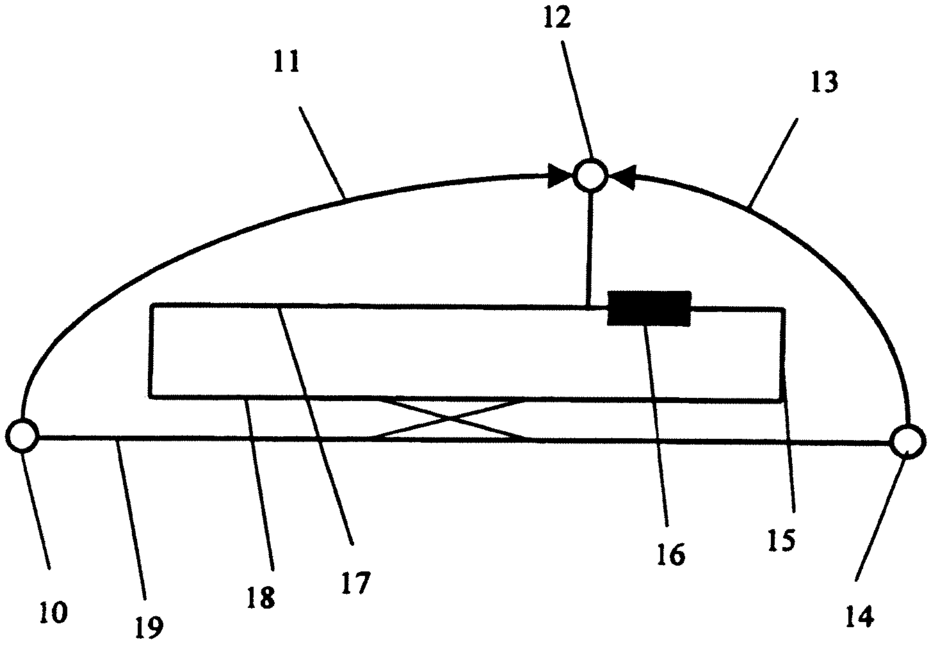
FIG. 1 shows a first exemplary schematic circuit diagram of a first exemplary embodiment of the directional coupler according to the invention.

FIG. 1 shows a first exemplary circuit diagram of a directional coupler according to the invention. A first line 19 is coupled to a second line 18. The first line provides the two ports 10 and 14. The second line is connected via a forward path 17 and a return path 15 to the port 12. In this context, an inductor 16 is connected in series to the return path 15 or respectively integrated in the return path 15. A coupling 11 of the signals from the port 10 to the port 12 is desired, while a coupling 13 from the port 14 to the port 12 is undesired. By transmitting the signals of the ports 10 and 14 via the forward path 17 and the return path 15 to the common port 12, a superposition of the signal components is achieved there. With an optimized length of the forward path 17 and of the return path 15 and an optimized size of the inductor 16, a desirable frequency characteristic of the sharpness of directivity is generated at the port 12 through constructive and destructive superposition.

Figure 2:
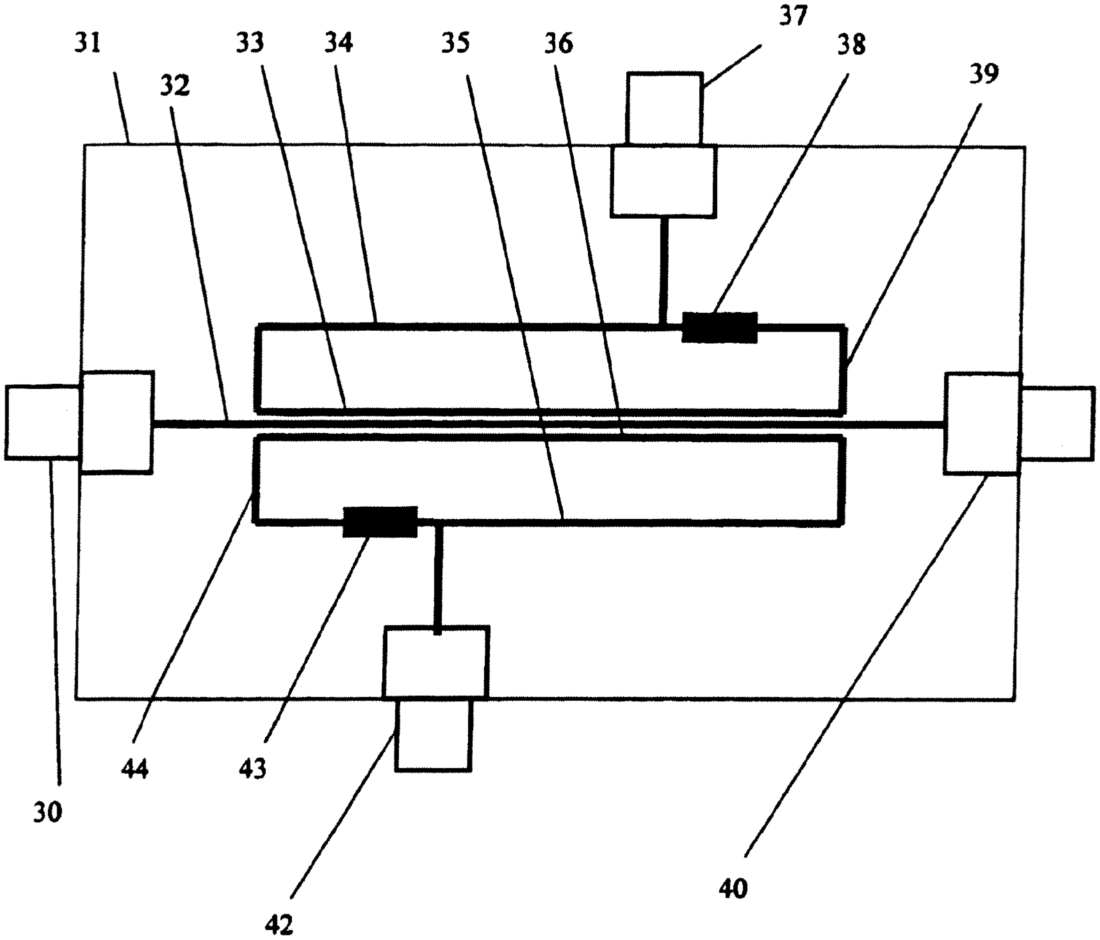
FIG. 2 shows an exemplary presentation of the arrangement of the components of the first exemplary embodiment of the directional coupler according to the invention.

FIG. 2 shows a first exemplary presentation of the arrangement of the components of the first exemplary embodiment of the directional coupler according to the invention illustrated in FIG. 1. The circuit is constructed on a substrate 31 with metallised rear side using stripline technology. The structure forms a directional coupler, which contains ports for both coupling directions. A first stripline 32 is terminated with two coaxial ports 30 and 40. Second striplines 33 and 36 are coupled to the first stripline 32. The second striplines 33 and 36 are connected via respectively a forward path 34 and 35 and respectively a return path 39 and 44 respectively to a coaxial port 37 and 42.

Inductors 38 and 43 are connected in series to the return paths 39 and 44, or respectively the inductors 38, 43 are integrated in the return paths 39, 44. The desired coupling directions extend from port 30 to port 37 and from port 40 to port 42. The undesired coupling directions extend from port 30 to port 42 and from port 40 to port 37. Through the spatial proximity of the first stripline 32 to the second striplines 33 and 36, the striplines are electromagnetically coupled. By transmitting the signals of the ports 30 and 40 via forward paths 34 and 35 and return paths 39 and 44 to the common ports 37 and 42, a superposition of the signal components is achieved there. Through an optimized length of the forward paths 34 and 35 and of the return paths 39 and 44 and an optimized size of the inductors 38 and 43, a desired frequency characteristic of the sharpness of directivity is generated at the ports 37 and 42 through constructive and destructive superposition within a broad frequency band.

The second striplines 33 and 36, the associated forward paths 34 and 35, return paths 39 and 44, inductors 38, 43 and coaxial ports 37 and 42 are arranged point-symmetrically to a point on the first stripline 32. Accordingly, a directional coupler with four ports 30, 37, 40 and 42 and two provided coupling directions is obtained.

Figure 3:
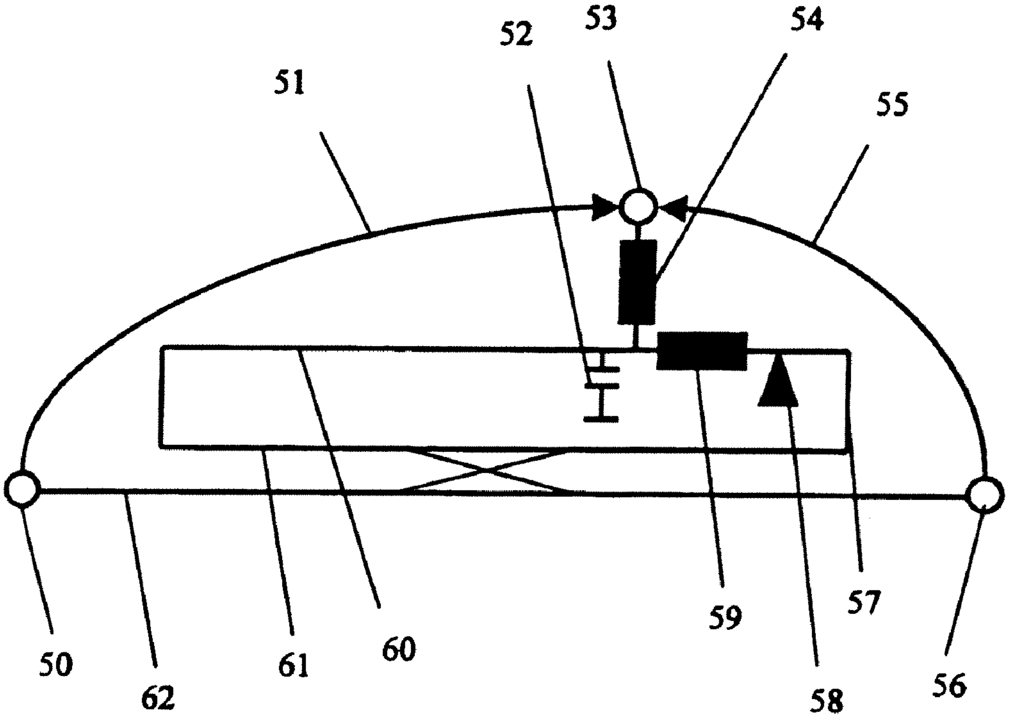
FIG. 3 shows a second exemplary embodiment of the directional coupler according to the invention.

FIG. 3 shows a second exemplary schematic circuit diagram of a second exemplary embodiment of the coupler according to the invention. A first line 62 is coupled to a second line 61. The first line provides the two ports 50 and 56. The second line is connected via a forward path 60 and a return path 57 to a port 53. In this context, an inductor 59 is connected in series to the return path or respectively integrated within the latter. A second inductor 54 is connected in series to the port 53 or integrated within the latter. A capacitor 52 is connected in parallel to the forward path 60 in that the forward path 60 is connected via the capacitor 52 to the reference potential or respectively the circuit ground. The inductor 54 and the capacitor 52 form an LC-element. A wave absorber or absorber 58 is connected in parallel to the return path 57 in that the return path 57 is connected via an ohmic resistor 58 to the reference potential or the circuit ground. A coupling 51 of the signals from the port 50 to the port 53 is desired, while a coupling 55 from the port 56 to the port 53 is undesired. By transmitting the signals of the ports 50 and 56 via the forward path 60 and the return path 57 to the common port 53, a superposition of the signal components is achieved there. Through an optimized length of the forward path 60 and of the return path 57 and an optimized size of the inductor 59, a desired frequency characteristic of the sharpness of directivity is achieved at the port 53 through constructive and destructive superposition. The additional LC-element is used for the precise adjustment of the desired frequency characteristic of the sharpness of directivity.

Figure 4:
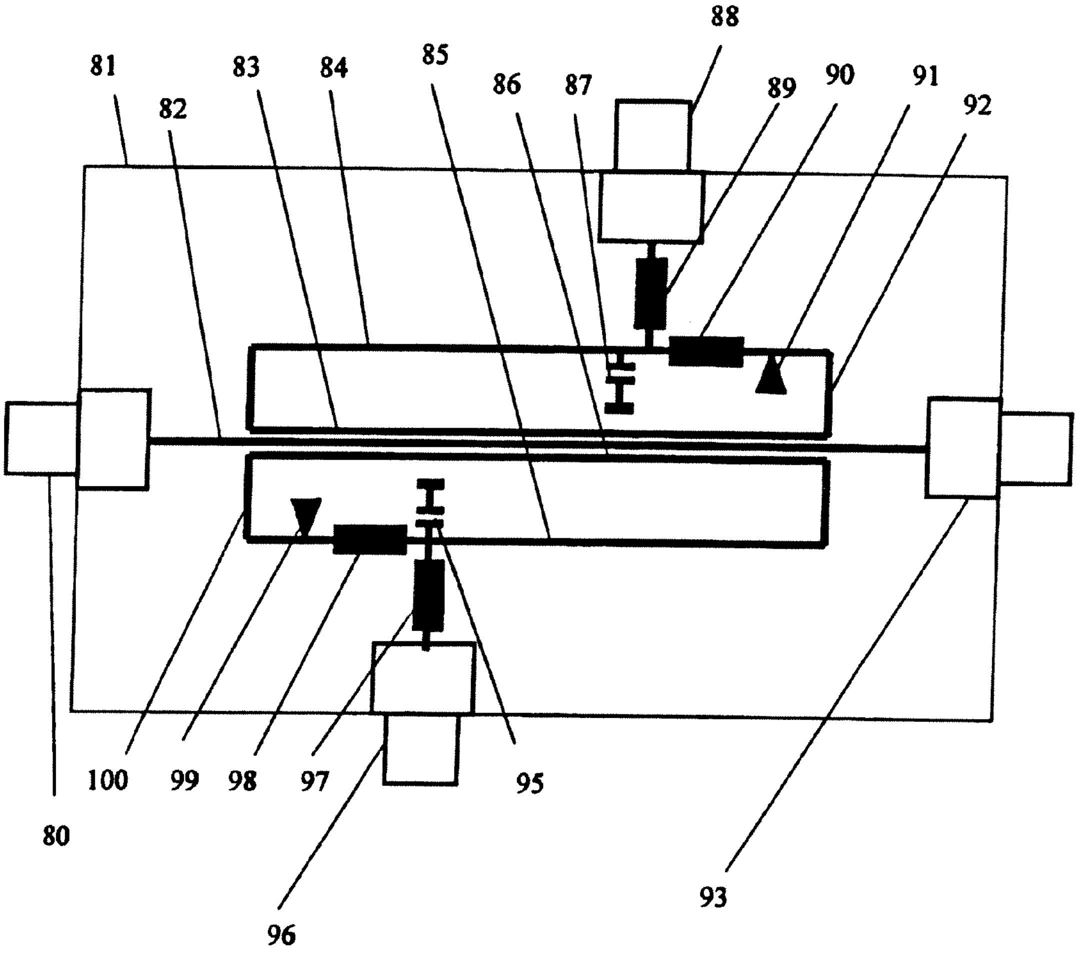
FIG. 4 shows an exemplary presentation of the arrangement of the components of the second exemplary embodiment of the directional coupler according to the invention.

FIG. 4 shows a second exemplary presentation of the arrangement of the components of a circuit according to the invention corresponding to the exemplary embodiment shown in FIG. 3. The circuit is constructed in stripline technology on a substrate with metallised rear side. This structure forms a directional coupler, which contains ports for both coupling directions. A first stripline 82 is terminated with two coaxial ports 80 and 93. Second striplines 83 and 86 are coupled to the first strip line 82. The second striplines 83 and 86 are connected in each case via a forward path 84 and 85 and respectively a return path 92 and 100 in each case to one coaxial port 88 and 96. First inductors 90 and 98 are connected in series to the return paths 92 and 100. Second inductors 89 and 97 are connected in series to the ports 88 and 96.

Additional capacitors 87 and 95 are connected in parallel to the forward paths 84 and 85. The capacitors 87 and 95 are connected to the metallised rear side of the substrate 81. The second inductors and the capacitors form LC-elements. Furthermore, absorbers 91 and 99 are connected in parallel to the return paths 92 and 100. The absorbers are realized through ohmic connections to the metallised rear side of the substrate 81.

The desired coupling directions extend from port 80 to port 88 and from port 93 to port 96. The undesired coupling directions extend from port 80 to port 96 and from port 93 to port 88. Through the spatial proximity of the first stripline 82 and the second striplines 83 and 86, the striplines are electromagnetically coupled. By transmitting the signals of the ports 80 and 93 via the forward paths 84 and 85 and the return paths 92 and 100 to the common ports 88 and 96, a superposition of the signal components is achieved there. Through an optimized length of the forward paths 84 and 85 and of the return paths 92 and 100 and an optimized size of the inductors 90 and 98, a desired frequency characteristic of the sharpness of directivity is generated within a broad frequency band at the ports 88 and 96 through constructive and destructive superposition. The additional LC-elements are used for the precise adjustment of the desired frequency characteristic of the sharpness of directivity.

The second striplines 83 and 86, the associated forward paths 84 and 85, return paths 92 and 100, inductors 89, 90 and 97, 98, capacitors 87 and 95, absorbers 91 and 99 and coaxial ports 88 and 96 are arranged point-symmetrically to a point on the first stripline 82. Accordingly, a directional coupler with four ports 80, 88, 93 and 96 and two provided coupling directions is obtained.

The invention is not restricted to the exemplary embodiment illustrated. Accordingly, further, different components influencing the frequency response of the sharpness of directivity can be used. Similarly, the use of the structure in multilayer printed circuit boards is also conceivable. All of the features described above or illustrated in the diagrams can be combined with one another as required within the framework of the invention.

The invention claimed is:

1. A directional coupler with at least two coupled lines and at least three ports for the directional transmission of high-frequency signals, wherein a first coupled line provides at least two ports, a second coupled line provides at least one port, a high-frequency signal from the first coupled line is transmitted to the second coupled line, the second coupled line is connected via a forward path and via a return path to a port of the second coupled line, a first inductor is connected in series to the return path, the port of the second coupled line is connected in series to a second inductor, the port of the second coupled line is connected in parallel to a capacitor, and the second inductor and the capacitor form an LC-element.

2. The directional coupler according to claim 1, wherein the transmission of signals from a first port of the first coupled line to the port of the second coupled line is only weakly attenuated, and the transmission of signals from a second port of the first coupled line to the port of the second coupled line is strongly attenuated.

3. The directional coupler according to claim 1, wherein the second coupled line is connected to an absorber or wave absorber.

4. The directional coupler according to claim 1, wherein a circuit comprising the directional coupler is constructed in stripline technology.

5. The directional coupler according to claim 4, wherein the coupled lines are disposed on a front side of a substrate, a rear side of the substrate is metallized, the absorber or wave absorber is formed by an ohmic connection to the metallized rear side of the substrate, and the metallized rear side of the substrate is connected to a reference potential.

6. The directional coupler according to claim 1, wherein a length of the forward path and/or a length of the return path and/or the size of the first inductor are dimensioned in such a manner that a good sharpness of directivity of the directional coupler is achieved over a broad frequency band.

7. The directional coupler according to claim 1, wherein the second inductor and the capacitor are dimensioned in such a manner that they determine the sharpness of directivity of the directional coupler.

8. The directional coupler according to claim 1, comprising two second coupled lines and two first inductors arranged point-symmetrically in such a manner that the point of symmetry is disposed on the first line.

9. The directional coupler according to claim 5, wherein the reference potential is ground potential.

10. The directional coupler according to claim 2, wherein the port of the second coupled line is connected in series to a second inductor, the port of the second coupled line is connected in parallel to a capacitor, and the second inductor and the capacitor form an LC-element.

11. The directional coupler according to claim 10, wherein the second inductor and the capacitor are dimensioned in such a manner that they determine the sharpness of directivity of the directional coupler.

12. A directional coupler with at least two coupled lines and at least three ports for the directional transmission of high-frequency signals, wherein a first coupled line provides at least two ports, a second coupled line provides at least one port, a high-frequency signal from the first coupled line is transmitted to the second coupled line, the second coupled line is connected via a forward path and via a return path to a port of the second coupled line, a first inductor is connected in series to the return path, the port of the second coupled line is connected in series to a second inductor, the port of the second coupled line is connected in parallel to a capacitor, and the second inductor and the capacitor form an LC-element, the transmission of signals from a first port of the first coupled line to the port of the second coupled line is only weakly attenuated, and the transmission of signals from a second port of the first coupled line to the port of the second coupled line is strongly attenuated.

13. The directional coupler according to claim 12, wherein the second coupled line is connected to an absorber or wave absorber.

14. The directional coupler according to claim 12, wherein a circuit comprising the directional coupler is constructed in stripline technology.

15. The directional coupler according to claim 14, wherein the coupled lines are disposed on a front side of a substrate, a rear side of the substrate is metallized, the absorber or wave absorber is formed by an ohmic connection to the metallized rear side of the substrate, and the metallized rear side of the substrate is connected to a reference potential.

16. The directional coupler according to claim 12, wherein a length of the forward path and/or a length of the return path and/or the size of the first inductor are dimensioned in such a manner that a good sharpness of directivity of the directional coupler is achieved over a broad frequency band.

17. The directional coupler according to claim 12, wherein the second inductor and the capacitor are dimensioned in such a manner that they determine the sharpness of directivity of the directional coupler.

18. The directional coupler according to claim 12, comprising two second coupled lines and two first inductors arranged point-symmetrically in such a manner that the point of symmetry is disposed on the first line.

19. The directional coupler according to claim 15, wherein the reference potential is ground potential.

20. The directional coupler according to claim 12, wherein the second inductor and the capacitor are dimensioned in such a manner that they determine the sharpness of directivity of the directional coupler.

* * * * *